US009665592B2

(12) United States Patent
Hirsch et al.

(10) Patent No.: US 9,665,592 B2
(45) Date of Patent: *May 30, 2017

(54) CONTROLLING SEGMENT SIZE DISTRIBUTION IN HASH-BASED DEDUPLICATION

(71) Applicant: INTERNATIONAL BUSINESS MACHINES CORPORATION, Armonk, NY (US)

(72) Inventors: Michael Hirsch, Mazkeret Batya (IL); Thomas S. Klein, Rehovot (IL); Yair Toaff, Givat Shmuel (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/727,466

(22) Filed: Jun. 1, 2015

(65) Prior Publication Data

US 2015/0261447 A1    Sep. 17, 2015

Related U.S. Application Data

(63) Continuation of application No. 13/732,505, filed on Jan. 2, 2013, now Pat. No. 9,069,478.

(51) Int. Cl.
| | |
|---|---|
| G06F 7/00 | (2006.01) |
| G06F 17/00 | (2006.01) |
| G06F 17/30 | (2006.01) |
| G06F 3/06 | (2006.01) |
| H03M 7/30 | (2006.01) |

(52) U.S. Cl.
CPC ...... *G06F 17/30156* (2013.01); *G06F 3/0608* (2013.01); *G06F 3/0619* (2013.01); *G06F 3/0641* (2013.01); *G06F 3/0665* (2013.01); *G06F 3/0689* (2013.01); *G06F 17/3033* (2013.01); *G06F 17/30097* (2013.01); *H03M 7/3091* (2013.01); *G06F 2003/0692* (2013.01)

(58) Field of Classification Search
CPC ......... G06F 17/30156; G06F 17/30159; G06F 17/30097
USPC ........................................................ 707/698
See application file for complete search history.

(56) References Cited

U.S. PATENT DOCUMENTS

| 7,504,969 B2 | 3/2009 | Patterson et al. |
| 7,733,910 B2 * | 6/2010 | Mace ............... H04L 47/10 370/473 |

(Continued)

OTHER PUBLICATIONS

Nie et al., "Optimization for data de-duplication algorithm based on file content," Journal: Frontiers of Optoelectronics in China, Springer Asia Ltd., vol. 3, No. 3, 2010.

(Continued)

*Primary Examiner* — Binh V Ho
(74) *Attorney, Agent, or Firm* — Griffiths & Seaton PLLC

(57) ABSTRACT

Segment sizes are controlled by setting the size of a segment boundary in a hash-based backup deduplication system in a distributed computing environment. A subsequence of size K of a sequence of characters S is set. Segment boundaries are set by using the sequence of the decreasingly restrictive logical tests if one of the sequence of the decreasingly restrictive logical tests returns a true value when applied on the sequence of characters S.

33 Claims, 7 Drawing Sheets

(56) References Cited

U.S. PATENT DOCUMENTS

| | | | |
|---|---|---|---|
| 8,572,055 B1* | 10/2013 | Wu | G06F 17/30097 |
| | | | 707/697 |
| 8,751,463 B1* | 6/2014 | Chamness | G06F 17/30153 |
| | | | 707/693 |
| 2002/0029282 A1* | 3/2002 | Buddhikot | H04N 7/17354 |
| | | | 709/231 |
| 2010/0088296 A1* | 4/2010 | Periyagaram | G06F 3/061 |
| | | | 707/705 |
| 2010/0205163 A1* | 8/2010 | Eshghi | G06F 11/1456 |
| | | | 707/698 |
| 2010/0246709 A1 | 9/2010 | Lillibridge et al. | |
| 2011/0125719 A1* | 5/2011 | Jayaraman | G06F 17/30156 |
| | | | 707/692 |
| 2011/0125722 A1* | 5/2011 | Rao | G06F 17/30156 |
| | | | 707/693 |
| 2012/0084268 A1* | 4/2012 | Vijayan | G06F 3/0652 |
| | | | 707/692 |
| 2012/0084269 A1* | 4/2012 | Vijayan | G06F 3/0652 |
| | | | 707/692 |
| 2012/0084270 A1 | 4/2012 | Jayaraman et al. | |
| 2012/0084527 A1 | 4/2012 | Jayaraman et al. | |
| 2013/0159262 A1* | 6/2013 | Jayaraman | G06F 17/30159 |
| | | | 707/692 |
| 2013/0238570 A1* | 9/2013 | Rao | G06F 17/30156 |
| | | | 707/692 |

OTHER PUBLICATIONS

Yakushev et al., "Optimization of fingerprint-based deduplication," Database: Simple (Dossier), 2011.

* cited by examiner

POSSIBLE REGIONS FOR CHUNK BOUNDARIES

SCHEMATIC REPRESENTATION OF THE EFFECT OF INSERT AND DELETE

PLOTTING PROBABILITY OF DECLARING A BOUNDARY AS FUNCTION OF CHUNK SIZE

CONTROLLING SEGMENT SIZE DISTRIBUTION IN HASH-BASED DEDUPLICATION

CROSS-REFERENCE TO RELATED APPLICATIONS

This application is a Continuation of U.S. patent application Ser. No. 13/732,505, filed on Jan. 2, 2013.

BACKGROUND OF THE INVENTION

Field of the Invention

The present invention relates in general to computers, and more particularly to controlling the distribution of segment sizes in a hash-based deduplication system in a computing environment.

Description of the Related Art

In today's society, computer systems are commonplace. Computer systems may be found in the workplace, at home, or at school. Computer systems may include data storage systems, or disk storage systems, to process and store data. Large amounts of data have to be processed daily and the current trend suggests that these amounts will continue being ever-increasing in the foreseeable future. An efficient way to alleviate the problem is by using deduplication. The idea underlying a deduplication system is to exploit the fact that large parts of the available data is copied again and again and forwarded without any change, by locating repeated data and storing only its first occurrence. Subsequent copies are replaced with pointers to the stored occurrence, which significantly reduces the storage requirements if the data is indeed repetitive.

SUMMARY OF THE DESCRIBED EMBODIMENTS

In one embodiment, a method is provided for controlling the distribution of a segment size in a hash-based backup deduplication system, in a distributed computing environment. Segment sizes are controlled by setting a segment boundary. A subsequence of size K of a sequence of characters S is set. Segment boundaries are set by using the sequence of the decreasingly restrictive logical tests if one of the sequence of the decreasingly restrictive logical tests returns a true value when applied on the sequence of characters S.

In addition to the foregoing exemplary method embodiment, other exemplary system and computer product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1:
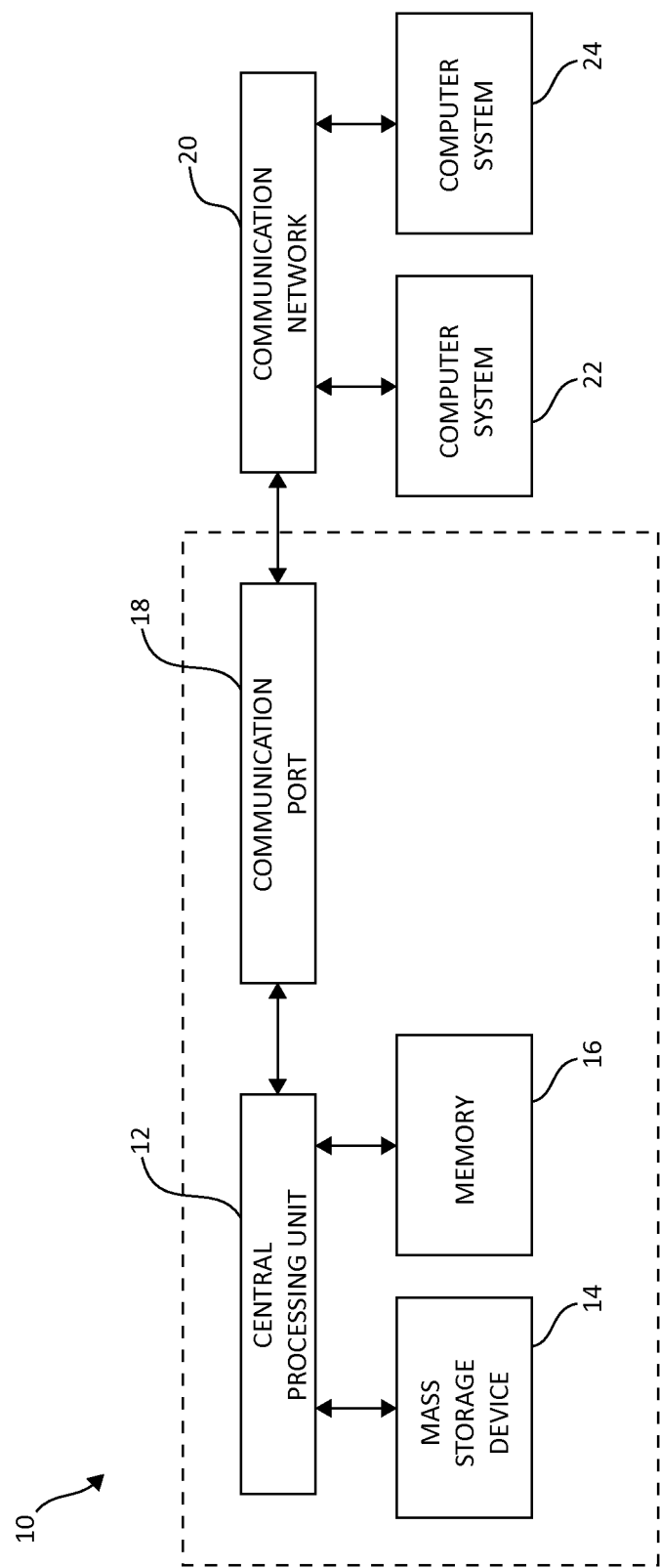
FIG. 1 is a block diagram illustrating a computing system environment having an example storage device in which aspects of the present invention may be realized.

Data deduplication refers to the reduction and/or elimination of repetitive data. The reduction of redundant data is known as compression. Deduplication is a special kind of compression, targeting repetitive data. In data deduplication, a data object, which may be a file a data stream, or some other form of data is broken down into one or more parts called sub-blocks. In a data deduplication process, duplicate copies of data are reduced or eliminated, leaving a minimal amount of redundant copies, or a single copy of the data, respectively. In other words, a deduplication system is based on the idea of partitioning a large repository into segments called chunks, and saving for each chunk a cryptographically strong hash value that can be used to identify the chunk with probability close to 1. Storing only the hash values in a table requires just a small fraction of the space occupied by the repository itself. If a new chunk is added to the repository, its hash value is searched for in the table, and if it is found, it may be concluded that the new chunk is an exact copy of a previous one, so all one needs to store is a pointer to the earlier occurrence. One approach may be to choose the chunk size as a constant. However, this results in a high sensitivity to small insertions and deletions. Indeed, even a single added or omitted byte could shift all subsequent chunk boundaries accordingly, invalidating the hash approach. Thus, a solution is to let the boundary of the chunk be dependent on the content itself, which implies variable length chunks.

A general paradigm for cutting the data string (e.g., "$s_1 s_2 \ldots$") into pieces is to use a rolling hash, which calculates a hash value for any consecutive sequence of k bytes. Such a sequence will be called a seed. Starting with the k-th byte of the data string, each byte can be considered as the last of a seed. The condition for deciding whether the last byte of the seed, denoted by $s_j$, will also be the last byte of the current chunk, is that $h(s_{j-k+1}s_{j-k+2} \ldots s_j)=C$, where h is the hash function and C is some constant. Since hash functions are supposed to return uniformly distributed values, the probability of this occurring is 1/M, where M is the size of the set of possible hash values, and it is independent of the specific value C chosen. The expected size of the chunks is then M. However, in reality, the sizes of the chunks may greatly vary, which is why it is necessary to impose lower and upper limits. For example, if an average size is targeted as 4K, the beginning of the segment may not even be checked, thereby assuring that the chunk size will not be below, for example, 1K. Similarly, if the condition has not been fulfilled by any seed and a chunk size of, for example, 8K, is already reached, the chunk may be cut at this point, regardless of the hash value.

While this strategy will indeed force the chunk size to be between 1K and 8K in this example, such "artificial" cut-off points suffer from the same weaknesses as those of the fixed sized chunks: small insertions and deletions may have an effect that propagates indefinitely. Thus, in one embodiment, the present invention seeks to rectify these shortcomings by controlling a segment size in a hash-based deduplication system, in a computing environment. Segment sizes are controlled by setting a chunk boundary in a hash-based deduplication system using a sequence of hash functions satisfying various probabilistic conditions.

Figure 4:
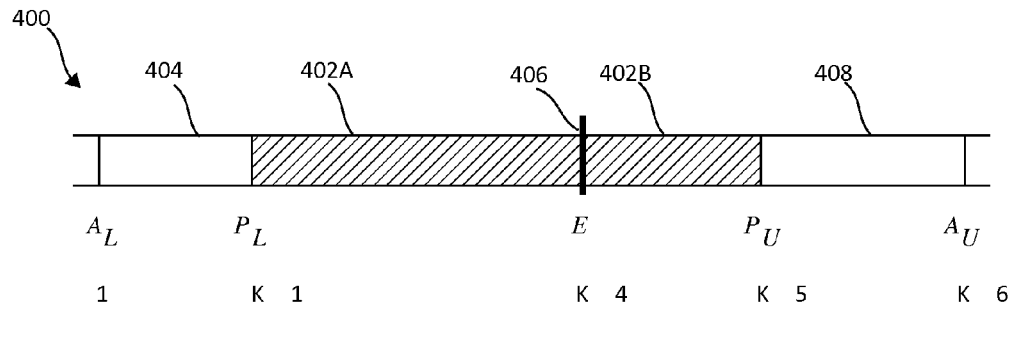
FIG. 4 is a block diagram illustrating regions for segment boundaries in a hash-based deduplication system in which aspects of the present invention may be realized.

In one embodiment, the decision on whether a given boundary candidate is indeed chosen depends solely and uniquely on a computed value and not on the boundary candidate's relationship to any of the other values or several values that correspond to a candidate's boundary position, and the selection of the chosen boundary by comparison between at least two such values. Thus, the computed values alone are used for determining whether a given boundary candidate is indeed chosen. Moreover, the present invention does not need uniformly distributed sizes, but rather includes 3 regions for the expected sizes of the segments as depicted in FIG. 4: a preferred size range, a permitted range below the preferred size range, and another permitted range above the preferred size range. By tuning the parameters, the embodiments described herein are able to transform the distribution of segment sizes from the segment size's usual form with exponential decrease and very long tail (as displayed in FIG. 8) to any predetermined bell-shaped curve with well defined minima and maxima points (FIG. 9 brings a hedgehog shaped curved, using simple integer arithmetic, which can easily be smoothened to a bell-shaped curve).

Turning now to FIG. 1, exemplary architecture 10 of a computing system environment is depicted. The computer system 10 includes central processing unit (CPU) 12, which is connected to communication port 18 and memory device 16. The communication port 18 is in communication with a communication network 20. The communication network 20 and storage network may be configured to be in communication with server (hosts) 24 and storage systems, which may include storage devices 14. The storage systems may include hard disk drive (HDD) devices, solid-state devices (SSD) etc., which may be configured in a redundant array of independent disks (RAID). The operations as described below may be executed on storage device(s) 14, located in system 10 or elsewhere and may have multiple memory devices 16 working independently and/or in conjunction with other CPU devices 12. Memory device 16 may include such memory as electrically erasable programmable read only memory (EEPROM) or a host of related devices. Memory device 16 and storage devices 14 are connected to CPU 12 via a signal-bearing medium. In addition, CPU 12 is connected through communication port 18 to a communication network 20, having an attached plurality of additional computer host systems 24. In addition, memory device 16 and the CPU 12 may be embedded and included in each component of the computing system 10. Each storage system may also include separate and/or distinct memory devices 16 and CPU 12 that work in conjunction or as a separate memory device 16 and/or CPU 12.

Figure 2:
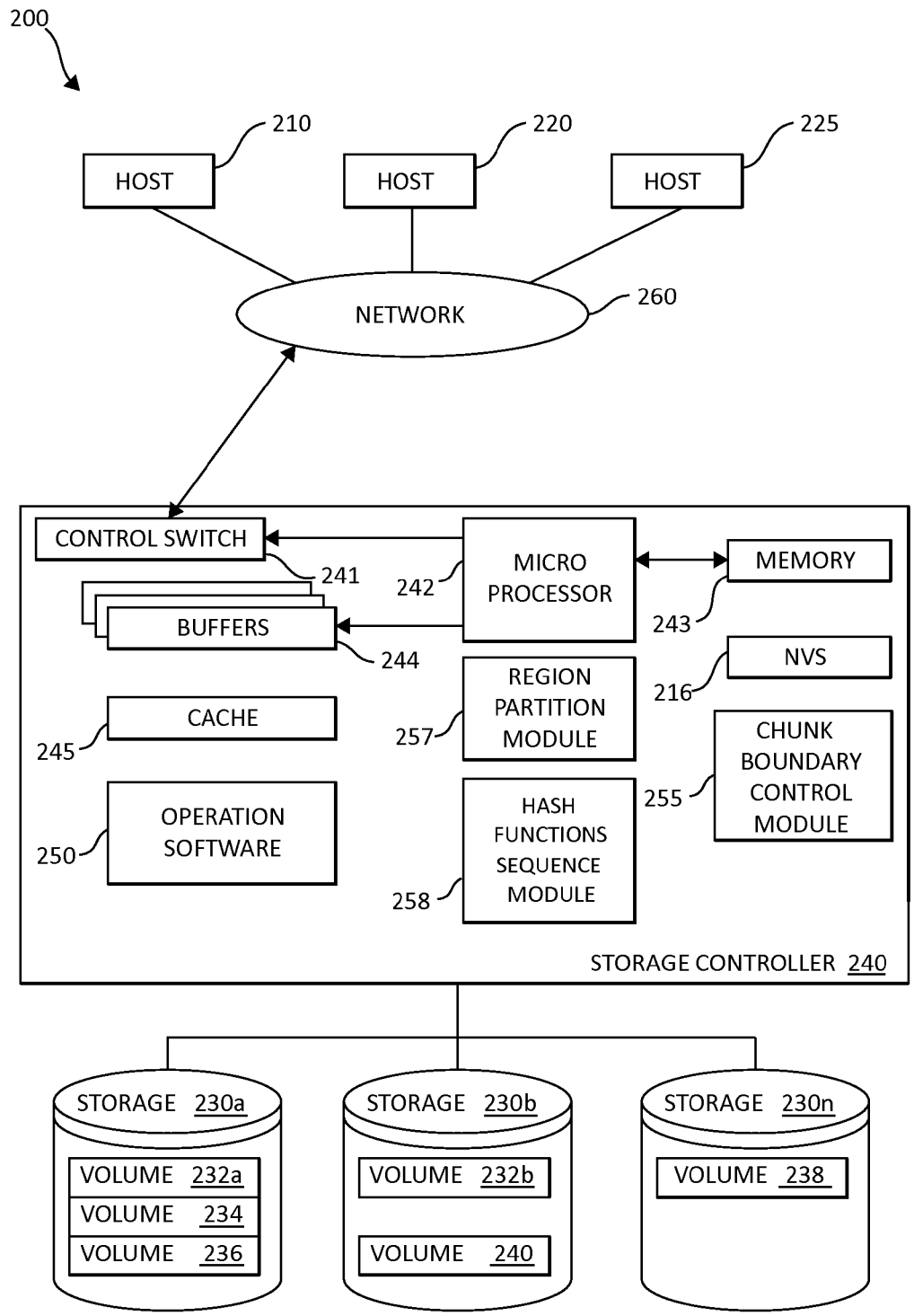
FIG. 2 is a block diagram illustrating a hardware structure of data storage system in a computer system in which aspects of the present invention may be realized.

FIG. 2 is an exemplary block diagram 200 showing a hardware structure of a data storage system in a computer system according to the present invention. Host computers 210, 220, 225, are shown, each acting as a central processing unit for performing data processing as part of a data storage system 200. The cluster hosts/nodes (physical or virtual devices), 210, 220, and 225 may be one or more new physical devices or logical devices to accomplish the purposes of the present invention in the data storage system 200. In one embodiment, by way of example only, a data storage system 200 may be implemented as IBM® System Storage™ DS8000™. A Network connection 260 may be a fibre channel fabric, a fibre channel point to point link, a fibre channel over ethernet fabric or point to point link, a FICON or ESCON I/O interface, any other I/O interface type, a wireless network, a wired network, a LAN, a WAN, heterogeneous, homogeneous, public (i.e. the Internet), private, or any combination thereof. The hosts, 210, 220, and 225 may be local or distributed among one or more locations and may be equipped with any type of fabric (or fabric channel) (not shown in FIG. 2) or network adapter 260 to the storage controller 240, such as Fibre channel, FICON, ESCON, Ethernet, fiber optic, wireless, or coaxial adapters. Data storage system 200 is accordingly equipped with a suitable fabric (not shown in FIG. 2) or network adaptor 260 to communicate. Data storage system 200 is depicted in FIG. 2 comprising storage controllers 240 and cluster hosts 210, 220, and 225. The cluster hosts 210, 220, and 225 may include cluster nodes.

To facilitate a clearer understanding of the methods described herein, storage controller 240 is shown in FIG. 2 as a single processing unit, including a microprocessor 242, system memory 243 and nonvolatile storage ("NVS") 216. It is noted that in some embodiments, storage controller 240 is comprised of multiple processing units, each with their own processor complex and system memory, and interconnected by a dedicated network within data storage system 200. Storage 230 (labeled as 230a, 230b, and 230n in FIG. 3) may be comprised of one or more storage devices, such as storage arrays, which are connected to storage controller 240 (by a storage network) with one or more cluster hosts 210, 220, and 225 connected to each storage controller 240.

In some embodiments, the devices included in storage 230 may be connected in a loop architecture. Storage controller 240 manages storage 230 and facilitates the processing of write and read requests intended for storage 230. The system memory 243 of storage controller 240 stores program instructions and data, which the microprocessor 242 may access for executing functions and method steps of the present invention for executing and managing storage 230 as described herein. In one embodiment, system memory 243 includes, is in association with, or is in communication with the operation software 250 for performing methods and operations described herein. As shown in FIG.

2, system memory 243 may also include or be in communication with a cache 245 for storage 230, also referred to herein as a "cache memory", for buffering "write data" and "read data", which respectively refer to write/read requests and their associated data. In one embodiment, cache 245 is allocated in a device external to system memory 243, yet remains accessible by microprocessor 242 and may serve to provide additional security against data loss, in addition to carrying out the operations as described in herein.

In some embodiments, cache 245 is implemented with a volatile memory and nonvolatile memory and coupled to microprocessor 242 via a local bus (not shown in FIG. 2) for enhanced performance of data storage system 200. The NVS 216 included in data storage controller is accessible by microprocessor 242 and serves to provide additional support for operations and execution of the present invention as described in other figures. The NVS 216, may also referred to as a "persistent" cache, or "cache memory" and is implemented with nonvolatile memory that may or may not utilize external power to retain data stored therein. The NVS may be stored in and with the cache 245 for any purposes suited to accomplish the objectives of the present invention. In some embodiments, a backup power source (not shown in FIG. 2), such as a battery, supplies NVS 216 with sufficient power to retain the data stored therein in case of power loss to data storage system 200. In certain embodiments, the capacity of NVS 216 is less than or equal to the total capacity of cache 245.

Storage 230 may be physically comprised of one or more storage devices, such as storage arrays. A storage array is a logical grouping of individual storage devices, such as a hard disk. In certain embodiments, storage 230 is comprised of a JBOD (Just a Bunch of Disks) array or a RAID (Redundant Array of Independent Disks) array. A collection of physical storage arrays may be further combined to form a rank, which dissociates the physical storage from the logical configuration. The storage space in a rank may be allocated into logical volumes, which define the storage location specified in a write/read request.

In one embodiment, by way of example only, the storage system as shown in FIG. 2 may include a logical volume, or simply "volume," may have different kinds of allocations. Storage 230a, 230b and 230n are shown as ranks in data storage system 200, and are referred to herein as rank 230a, 230b and 230n. Ranks may be local to data storage system 200, or may be located at a physically remote location. In other words, a local storage controller may connect with a remote storage controller and manage storage at the remote location. Rank 230a is shown configured with two entire volumes, 234 and 236, as well as one partial volume 232a. Rank 230b is shown with another partial volume 232b. Thus volume 232 is allocated across ranks 230a and 230b. Rank 230n is shown as being fully allocated to volume 238—that is, rank 230n refers to the entire physical storage for volume 238. From the above examples, it will be appreciated that a rank may be configured to include one or more partial and/or entire volumes. Volumes and ranks may further be divided into so-called "tracks," which represent a fixed block of storage. A track is therefore associated with a given volume and may be given a given rank.

The storage controller 240 may include a chunk boundary control module 255, a region partition module 257, and a hash functions sequence module 258. The chunk boundary control module 255, the region partition module 257, and the hash functions sequence module 258 may work in conjunction with each and every component of the storage controller 240, the hosts 210, 220, 225, and storage devices 230. The chunk boundary control module 255, the region partition module 257, and the hash functions sequence module 258 may be structurally one complete module or may be associated and/or included with other individual modules. The chunk boundary control module 255, the region partition module 257, and the hash functions sequence module 258, may also be located in the cache 245 or other components.

The storage controller 240 includes a control switch 241 for controlling the fiber channel protocol to the host computers 210, 220, 225, a microprocessor 242 for controlling all the storage controller 240, a nonvolatile control memory 243 for storing a microprogram (operation software) 250 for controlling the operation of storage controller 240, data for control, cache 245 for temporarily storing (buffering) data, and buffers 244 for assisting the cache 245 to read and write data, a control switch 241 for controlling a protocol to control data transfer to or from the storage devices 230, the chunk boundary control module 255, the region partition module 257, and the hash functions sequence module 258, in which information may be set. Multiple buffers 244 may be implemented with the present invention to assist with the operations as described herein. In one embodiment, the cluster hosts/nodes, 210, 220, 225 and the storage controller 240 are connected through a network adaptor (this could be a fibre channel) 260 as an interface i.e., via at least one switch called "fabric."

In one embodiment, the host computers or one or more physical or virtual devices, 210, 220, 225 and the storage controller 240 are connected through a network (this could be a fibre channel) 260 as an interface i.e., via at least one switch called "fabric." In one embodiment, the operation of the system shown in FIG. 2 will be described. The microprocessor 242 may control the memory 243 to store command information from the host device (physical or virtual) 210 and information for identifying the host device (physical or virtual) 210. The control switch 241, the buffers 244, the cache 245, the operating software 250, the microprocessor 242, memory 243, NVS 216, chunk boundary control module 255, the region partition module 257, and the hash functions sequence module 258 are in communication with each other and may be separate or one individual component(s). Also, several, if not all of the components, such as the operation software 250 may be included with the memory 243. Each of the components within the devices shown may be linked together and may be in communication with each other for purposes suited to the present invention.

As mentioned above, the chunk boundary control module 255, the region partition module 257, and the hash functions sequence module 258, may also be located in the cache 245 or other components. As such, one or more of the chunk boundary control module 255, the region partition module 257, and the hash functions sequence module 258, may be used as needed, based upon the storage architecture and users preferences.

Figure 3:
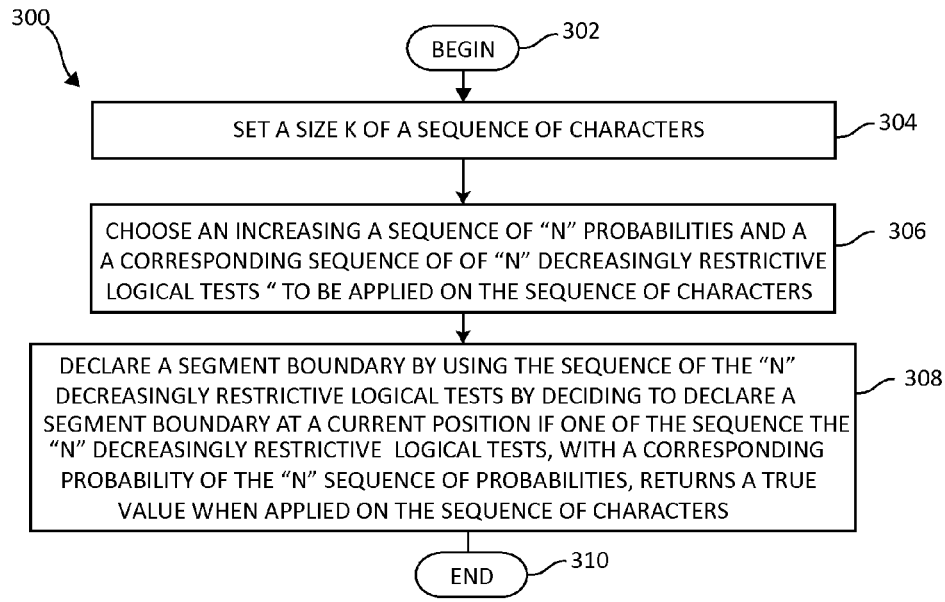
FIG. 3 is a flowchart illustrating an exemplary method for controlling segments in a hash-based deduplication system.

FIG. 3 is a flowchart illustrating an exemplary method for controlling the distribution of a segment size in a hash-based deduplication system, in a computing environment. The method 300 begins (step 302) controlling a segment size distribution in a hash-based deduplication system by setting a size K of a sequence of characters S (step 304). An increasing sequence of n probabilities and a corresponding sequence of n decreasingly restrictive logical tests to be applied on the sequence of characters S are chosen (step 306). The method 300 may declare a segment boundaries by using the sequence of the decreasingly restrictive logical tests by deciding to declare a segment boundary at a current position if one of the sequence of the decreasingly restrictive logical tests, with the corresponding probability of the n sequence of probabilities, returns a true value when applied on a sequence of characters S (step 308). The method 300 ends (step 310).

In one embodiment, as described in FIG. 3, segment sizes are controlled by setting a segment boundary in a hash-based deduplication system. A subsequence of size K of a sequence of characters S is set, and this set S may be chosen as a string of K characters extending up to a current position. (It should be noted that S may be some set, and not the whole segment.) An increasing sequence of n probabilities and a corresponding sequence of n decreasingly restrictive logical tests are chosen to be applied on the string S. Segment boundaries are set by using the sequence of the decreasingly restrictive logical tests by deciding to declare a segment boundary at a current position if one of the sequence of the decreasingly restrictive logical tests, with the corresponding probability of the sequence of probabilities, returns a true value when applied on a string S. For every string S of the subsequence of size K, a truth of one of the sequence of the decreasingly restrictive logical tests $B_i(S)$ implies a truth of all of a sequence of the decreasingly restrictive logical tests $B_j(S)$, for j>i where i and j are numbers between 1 and n. The sequence of decreasingly restrictive logical tests $B_i$ include using a corresponding sequence of hash functions $h_i$ and a corresponding sequence of constants $C_i$ based on a plurality of conditions, wherein i is a number between 1 and n. The sequence of hash functions $h_i$ are applied on the string S, and the results are compared to the sequence of constants $C_i$. The sequence of the decreasingly restrictive logical tests $B_i(S)$ is one of $h_i(S)=C_i$, or $h_i(S)<C_i$ or $h_i(S)>C_i$. The sequence of the hash functions are used for partitioning the segment into at least three regions delimited by four values corresponding to an absolute lower limit ($A_L$), a preferred lower limit ($P_L$), a preferred upper limit ($P_U$), and an absolute upper limit ($A_U$) for occurrence of the segment boundary. An expected size E of the segment to be within a range between the preferred lower limit ($P_L$) and the preferred upper limit ($P_U$) is set. The sequence of decreasingly restrictive logical tests are repeatedly performed on each current position. A range is divided up between the absolute lower limit ($A_L$) and the preferred lower limit ($P_L$) into sub-intervals in which the sequence of hash functions used range from $h_1$ and up to $h_{j_0-1}$. A range is divided up between the preferred upper limit ($P_U$), and the absolute upper limit ($A_U$) into sub-intervals in which the sequence of hash functions used range from $h_{j_0+1}$ up to $h_n$. The same hash function ($h_{j_0}$) is used while a size of a segment is between the preferred lower limit ($P_L$) and the preferred upper limit ($P_U$). A highest probability $p_n$ of the sequence of probabilities is set to be 1 thereby limiting the segment from being extended after the absolute upper limit ($A_U$). A large random prime number P and a large random number C and a decreasing sequence of integers $r_1$, $r_2, \ldots, r_n$ subject to the constraints $r_1 > r_2 > \ldots > r_{j_0-1} > r_{j_0} = \log_2 E > r_{j_0+1} > \ldots > r_{n-1} > r_n = 0$ are chosen. A value of the sequence of hash function $h_i(S)$ is set to be a number represented by the $r_i$ rightmost bits of a binary representation of a remainder of an integer represented by a string of characters S, modulo P, and setting the $C_i$ as the integer represented by the $r_i$ rightmost bits of C.

In one embodiment, the controlling of the segment size in the hash-based deduplication systems is based on using a sequence of functions ($h_i$) and constants ($C_i$), rather than working with a single hash function h and a single constant C. The sequence of functions $h_i$ and constants $C_i$, with i=1, 2, ..., n, fulfill the following conditions:

First Condition: All functions $h_i$ are fast to calculate. With the first condition, the idea is that these functions will not take a lot of CPU time, since the reason for using them is to gain time by avoiding comparisons. In one embodiment, a predetermined time may be used for determining "fast" and/or "fast" may be based upon the capabilities of the hardware components in the current state of the art.

Second Condition: there exists an increasing sequence of probabilities $p_1, p_2, \ldots p_n$, such that for any string S of fixed length K, the following condition is satisfied: for i=1, 2, . . . , n, if one applies the hash function $h_i$ to S, it will happen with probability $p_i$ that the resulting value will be equal to $C_i$.

Third Condition: For every string S and for every pair of indices i and j, such that j>i, the fact that $h_i(S)=C_i$ that is, the fact that if one applies the hash function $h_i$ to S, the result will be equal to $C_i$, implies that $h_j(S)=C_j$, that is, the fact that if one applies the hash function $h_j$ to S, the result will be equal to $C_j$.

The sequence of functions $h_j$ is then used to partition the potential segment that is being built into three regions, delimited by the four values corresponding to an absolute lower limit $A_L$, a preferred lower limit $P_L$, a preferred upper limit $P_U$, and an absolute upper limit $A_U$ for the occurrence of the (right) chunk boundary, as depicted in FIG. 4. FIG. 4 illustrates the regions for chunk values with a target value of the expected size, E, which is indicated by the darkened bar 406. (The graph is showing the chunk sizes between 1K and 6K). Preferably, it is desired that the target value fall between $P_L$ and $P_U$, however, the illustrated embodiments may tolerate exceeding these limits, but not below $A_L$ and not above $A_U$. This is achieved by choosing one of the probabilities from the sequence of probabilities $p_1, p_2, \ldots p_n$, which define the second condition, for example the one with index $j_0$, $1<j_0<n$, and setting this probability to be equal to 1/E, e.g., $p_{j_0}=1/E$. It should be noted that the procedure of the present invention for cutting the segment being built at the current position is checking whether $h_j(s)=C_j$, where S is the string extending up to the current position, and repeating this test for every byte, i.e., considering overlapping strings of length K. In one embodiment, the same function $h_{j_0}$ is used while the segment size is in the preferred zone 402 A and 402 B, between $P_L$ and $P_U$. However, the range 404 between $A_L$ and $P_L$ will be partitioned into sub-intervals (not shown) in which the sequence of hash functions used, in order, are $h_1$, $h_2, \ldots, h_{j_0-1}$, and similarly, the range 408 between $P_U$ and $A_U$ will be partitioned into sub-intervals (not shown) in which the sequence of hash functions used, in order, are $h_{j_0+1}, \ldots, h_n$. An example of possible values for these functions can be found in FIG. 6. Since the last probability $p_n$ has been chosen as equal to 1, the test for $h_n$ has a probability of 1 to succeed, or in other words, cannot fail. Thus one is assured that $A_U$ is indeed an upper limit.

Thus, one of the main advantages of using the embodiments described herein is that the segment size requires no artificial lower or upper limits, because these limits are obtained in a natural and consistent way, so that the segmenting processes described herein can be applied without all the drawbacks mentioned above. In one embodiment, the decision on whether a given boundary candidate is indeed chosen depends solely and uniquely on a computed value and not on the boundary candidate's relationship to any of the other values or several values, each of which correspond to a candidate's boundary position, and the selection of the chosen boundary by comparison between at least two such values. Thus, the computed value alone is used for determining whether a given boundary candidate is indeed chosen.

As mentioned, the present invention controls the segments boundaries based on the chosen conditions on the sequence of hash functions. The first condition, as described above, is a fundamental requirement of all hash functions. The second condition, as described above, allows for defining a cut-off condition for the segment boundary differently depending on the number of the already accumulated bytes in the current segment. For example, in one embodiment, the present invention starts with a very low probability of setting the boundary of the segment, so that very small segments will almost surely not appear. As the present invention approaches closer to the target size (e.g., for example 4K), the larger the probability will be, and within a range to be chosen around the ideal segment size (e.g., for example between 2K and 6K). In the target size zone, the probability for setting the segment boundary will be constant. Once this upper limit is passed, the cut-off probability will start rising/increasing. This rise in the cut-off probability makes it increasingly more difficult to extend the segment further. In other words, this increasing cut-off probability, which increases after the upper limit, allows for the upper limit to be a real and defined region, rather than an artificial region. More specifically, an absolute upper size of the segment can be imposed by defining $p_n=1$, that is, the first string of length K considered when getting to the last function will be declared as being the last string of length K of the current segment. As mentioned above, the last probability $p_n$ has been chosen as equal to 1, the test for $h_n$ has a probability of 1 to succeed, or in other words, cannot fail. Thus, the present invention repeatedly tests at every byte whether to set there the boundary by checking whether $h_i(S)=C_i$. At any step, this can be true, which means that the present invention decides to put the boundary at a particular byte, or it can fail, which means that the present invention continues. But the probability of continuing decreases, and at the end it is set to 0, which means that the process, if it continued without placing a boundary at a particular byte, is forced to stop.

Figure 5:
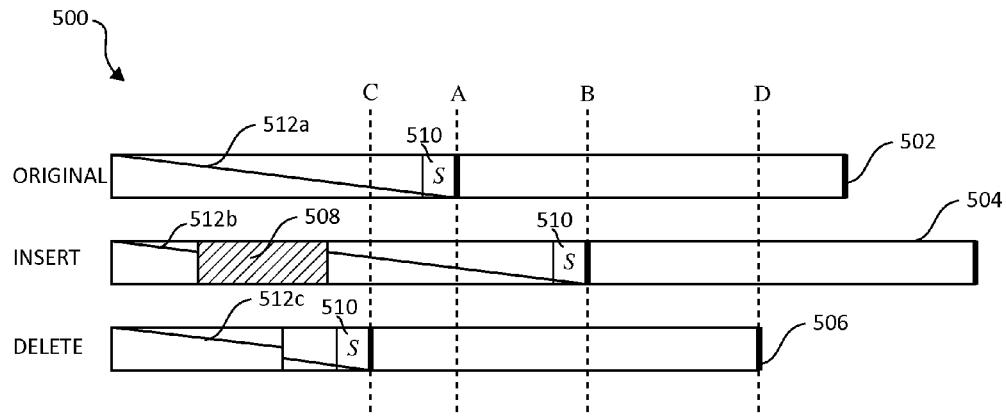
FIG. 5 is a block diagram illustrating effect of inserting and deleting of bytes within segments in a hash-based deduplication system in which aspects of the present invention may be realized.

The third condition, as described above, deals with inserts and deletes (e.g., inserting and deleting of bytes). The present invention deals with a deduplication system, in which several versions of the same data have to be stored, and different versions may be very similar. Thus, the present invention refers explicitly to small changes introduced between one version and the following version, and handles and deals with inserts and deletes. This is further explained by considering FIG. 5, below. FIG. 5 is a block diagram illustrating the effect of inserting and deleting of bytes within segments in a hash-based deduplication system in which aspects of the present invention may be realized. The top line 502 (labeled as "original") represents two consecutive segments of the original data. (The middle line 504 labeled with "insert" and the bottom line 506 labeled with "delete" and the segments boundaries are shown with the letters "C", "A", "B", and "D" for illustration purposes of FIG. 5. Also, a downward sloping line starting from the top left and slowing downward toward the bottom right is used to identify a segment (e.g., segments 512 and 514). FIG. 5 may be explained using the following scenario. Suppose that a short sequence of new bytes 508 is inserted in the middle line 504 of the FIG. 5 labeled "insert". There is of course the possibility that one of the newly added strings of length K 510 (labeled as "S") will fulfill the cut-off condition, but if the inserted block 508 is small, this possibility might be negligible. If no new boundary has been declared, the string S 510, which ended at position A in the original layout of the top line 502, is pushed further to position B in the middle line 504, which implies that the test applied on it satisfies the equation, as mentioned above, that $h_j(S)=C_j$ for some $j \geq i$, and therefore S will be declared as boundary and subsequent segments will not be affected.

On the other hand, as seen in the bottom line 506, if some bytes have been deleted from the first segment 512, the string S is moved to an earlier position C, so the condition checked on the string satisfies the equation $h_j(S)=C_j$ for some $j \leq i$, and because of the third condition, it may be stricter than before. In other words, the third condition states that if j is larger than i, then equality for i implies equality for j, so the condition on i is stricter than the condition on j. Here, j is smaller than i. It is thus possible that the boundary at level C will be missed. But depending on the number of deleted bytes, the condition might also be the same (if j=i) or if i−j is small, the probability of getting even this cut-off point may not be too low. In any case, even if this segment limit at point C is lost, the next one, which has now been moved backwards to position D, may still be to the right of A, so it may be caught.

In one embodiment, the limiting values may be set as shown in FIG. 4. To define the sequence of functions $h_i$, a random large prime number P is first chosen. Since arithmetic may be performed modulo P, it may be convenient, by way of example only, to restrict the present invention to 64-bit operations, implying $P<2^{64}$. If a new random prime is chosen in every calculation, as is done in a Rabin-Karp pattern matching, there may be no need to impose a lower limit on P, since the probability of repeatedly choosing small primes is negligible. However, by way of example only, since it is intended to use a single prime for the entire system, negative results may be eliminated by requiring also that $P>2^{60}$. This assures that P has at least 60 significant bits, without being too restrictive, since the number of primes in the given range is of the order of $2^{55}$. In one embodiment, let $r_1, r_2, \ldots, r_n$ be a decreasing sequence of integers, subject to the constraints $$32 = r_1 > r_2 > \ldots > r_{j_0-1} > r_{j_0} = \log_2 E > r_{j_0+1} > \ldots > r_{n-1} > r_n 0, \quad (2)$$

and the functions $h_i$, for $i=1, 2, \ldots, n$, be defined as:

$$h_i(S) = (S \bmod P) \bmod 2^{r_i} \quad (3)$$

in other words, $h_i(S)$ are the $r_i$ rightmost bits of the remainder of S modulo P. The next step is to choose a random 32-bit constant C, and to define $C_i = C \bmod 2^{r_i}$, that is, the $C_i$ are the $r_i$ rightmost bits of C. Theoretically, $C_i$ may be chosen at random, if indeed the hash functions gave uniformly distributed values. It may also be more convenient to have all the $C_i$ as suffixes of different lengths of the same binary string, enabling to fulfill the third condition, as mentioned above. In the alternative embodiment, the following parameters may be chosen:

n=18, $j_0$=11;
$(r_1, \ldots, r_{10})$=(32, 30, 28, 26, 24, 22, 20, 18, 16, 14), $r_{11}$=12, $(r_{12}, \ldots r_{18})$=(11, 9, 7, 5, 3, 1, 0).

Figure 6:
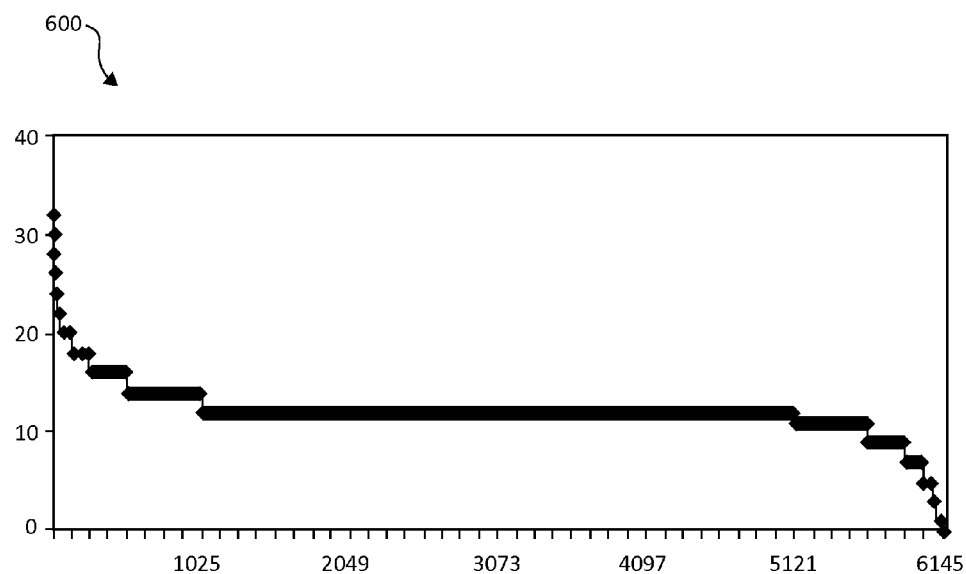
FIG. 6 is a graph illustrating an exemplary probability distribution of declaring segment boundaries as a function of segment size in a hash-based deduplication system in which aspects of the present invention may be realized.

As described below, FIG. 6 is a plot of the number of bits involved in the hashing (which is minus the log of the probability of declaring the current position as a boundary point) as function of the current size of the chunk being built. FIG. 6 is a graph illustrating an exemplary probability distribution of declaring segment boundaries as a function of segment size in a hash-based deduplication system in which aspects of the present invention may be realized. (The Y-axis illustrates the number of bits used to define the probabilities and the X-axis illustrates the number of bytes in the segment.) As illustrated in FIG. 6, the present invention starts with a very low probability, $2^{-32}$, which gradually increases (i.e., the number of bits decreases). The sizes of the corresponding ranges start with 2 bytes for 32 bits and 2 bytes for 30 bits, and then double at each step (e.g., 4 bytes for 28 bits, 8 bytes for 26 bits, . . . , 512 bytes for 14 bits). This corresponds to the range from $A_L$ to $P_L$ and spans exactly 1K. Then from 1K to 5K the present invention stay with 12 bits (illustrated as the flat, horizontal line on the graph), which has a probability of $2^{-12}$, and then continue increasing the probabilities, this time on ranges that start with 512 bytes for 11 bits, then halving to 256 bytes for 9 bits, . . . , 64 bytes for 5 bits, 32 bytes for 3 bits and 31 bytes for 1 bit. There is also a possibility for 0 bits, but a range of only 1 byte is assigned since it guarantees success at the first try.

Figure 7:
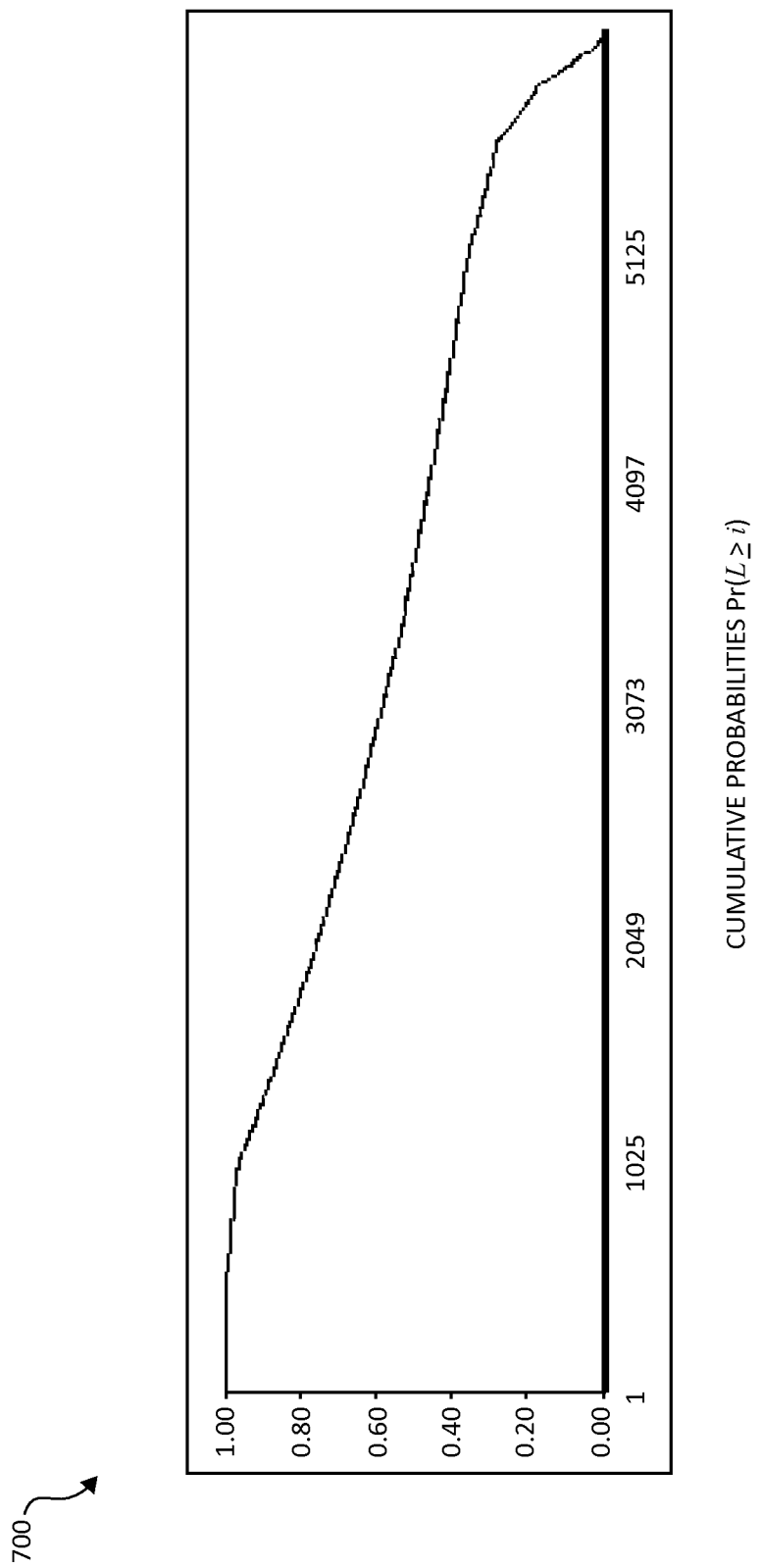
FIG. 7 is a graph illustrating an exemplary distribution of chunk sizes in a hash-based deduplication system where the distribution is given by displaying, for each chunk size L, the probability of getting a chunk larger than L, in which aspects of the present invention may be realized.

FIG. 7 is a graph illustrating an exemplary distribution of segment sizes in a hash-based deduplication system where the distribution is given by displaying, for each segment size L, the probability of getting a chunk larger than L, in which aspects of the present invention may be realized. FIG. 7 is a graph illustrating exemplary cumulative probabilities of having the segment size larger than a variable x, represented by the x-axis, in a hash-based deduplication system in which aspects of the present invention may be realized. As illustrated in FIG. 7, L denotes the length of a given segment, which is a random variable whose expected value is the value in which the present invention is interested. To evaluate the expected size of the segment for any given settings, the following formula is used:

$$E(L) = \sum_{i=1}^{A_U} Pr(L \geq i), \quad (4)$$

where E(L) is the expected size of the segment, L is the length of the given segment, i is the running index going over the range of possible values of L from 1 to $A_U$, and Pr denotes the probability function. The probabilities depend on the given segment. To start with, $Pr(L \geq 1) = 1$. In general, the event that $L \geq i$ is equivalent to having failures in the i−1 first trials. In other words, hash values of the i−1 first strings considered do not match the target values. FIG. 7 illustrates and plots the probabilities $Pr(L \geq i)$ as a function of i. The x-axis illustrates the number of bytes in the segment, and the y-axis are cumulative probabilities. As can be seen, the probability of having the segment size larger than just a few bytes is almost equal to 1, and then slowly decreases for larger segment sizes. At the rightmost end, for a segment size of 6K=6144 bytes, the probability of getting a larger segment is 0, which means that the largest possible segment has size 6K. The expected size of a segment is then $$E(L) = \sum_{i=1}^{A_U} Pr(L \geq i) = 3744,$$

as described above.

Figure 8:
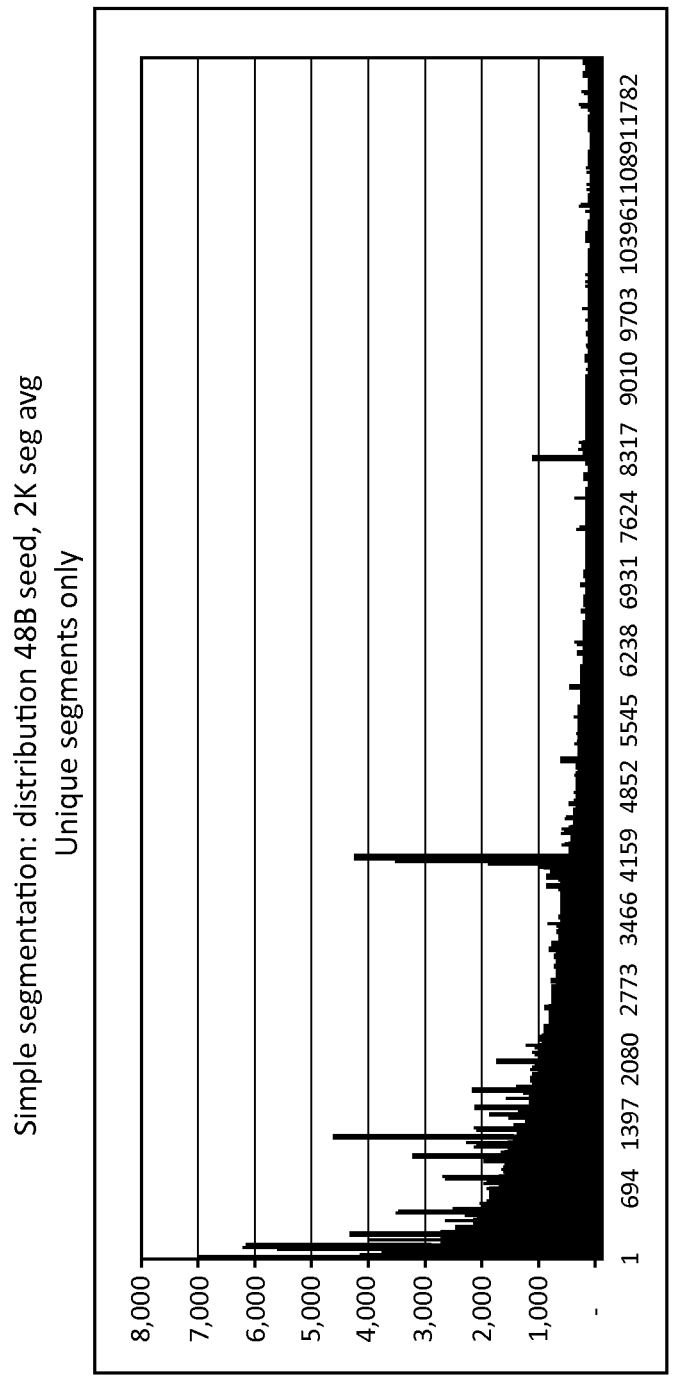
FIG. 8 is a graph illustrating an exemplary distribution of segment sizes of a dataset using partitioning based on low bandwidth network file system (LBFS)
Figure 9:
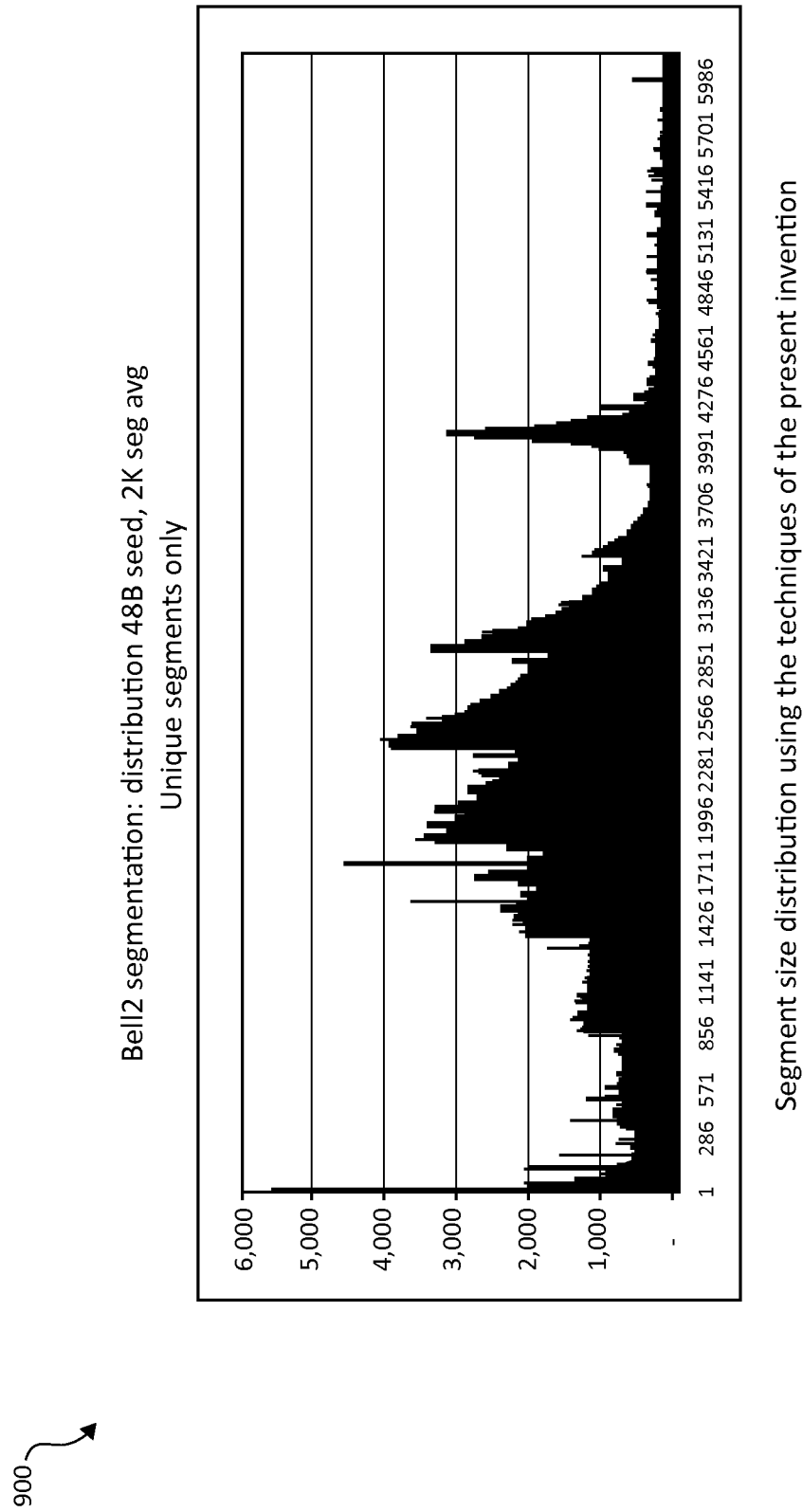
FIG. 9 is a graph illustrating an exemplary segment size distribution in which aspects of the present invention may be realized.

As mentioned previously, the decision on whether a given boundary candidate is indeed chosen depends solely and uniquely on a computed value and not on the boundary candidate's relationship to any of the other values or several values that correspond to a candidate's boundary position, and the selection of the chosen boundary by comparison between at least two such values. Thus, the computed values alone are used for determining whether a given boundary candidate is indeed chosen. Moreover, the present invention does not need uniformly distributed sizes, but rather includes three regions for the expected sizes of the segments as depicted in FIG. 4: a preferred size range, a permitted range below the preferred size range, and another permitted range above the preferred size range. Turning now to FIG. 8 and FIG. 9, FIG. 8 is a graph illustrating an exemplary distribution of segment sizes of a dataset using partitioning based on low bandwidth network file system (LBFS). The X-axis represents the segment sizes and the Y-axis shows the number of data segments having that segment size. As stated in FIG. 8, a simple segmentation distribution is illustrated for a dataset having 48-byte strings on which the hash functions have been applied, with 2000 (2K) being an average segment size.

FIG. 9 is a graph illustrating an exemplary segment size distribution in which aspects of the present invention may be realized. Similar to FIG. 8, in FIG. 9, the X-axis represents the segment sizes and the Y-axis shows the number of data segments having that segment size. A segmentation distribution is illustrated for the dataset having 48-byte strings on which the hash functions have been applied, with 2000 (2K) being an average segment size. As illustrated in FIG. 8 and FIG. 9, by tuning the parameters as described in FIG. 3-7, the embodiments described herein are able to transform the distribution of segment sizes from the segment size's usual form with exponential decrease and very long tail (as displayed in FIG. 8) to any predetermined bell-shaped curve with well defined minima and maxima points. FIG. 9 brings a hedgehog shaped curved, using simple integer arithmetic, which can easily be smoothened to a bell-shaped curve.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method for controlling the distribution of segment sizes in a backup deduplication system using a processor device in a distributed computing environment, the method comprising:

setting a subsequence of size K of a sequence of characters S; and declaring segment boundaries by using a sequence of the decreasingly restrictive logical tests if one of the sequence of the decreasingly restrictive logical tests returns a true value when applied on the sequence of characters S.

2. The method of claim 1, further including choosing an increasing sequence of n probabilities and a corresponding sequence of n decreasingly restrictive logical tests to be applied on the sequence of characters S; and declaring segment boundaries by using the sequence of the decreasingly restrictive logical tests by deciding to declare a segment boundary at a current position if one of the sequence of the decreasingly restrictive logical tests, with a corresponding probability of the sequence of n probabilities, returns a true value when applied on the sequence of characters S.

3. The method of claim 2, wherein for every one of the sequence of characters S of the subsequence of size K, a truth of one of the corresponding sequence of the decreasingly restrictive logical tests $B_i(S)$ implies a truth of all of a sequence of the decreasingly restrictive logical tests $B_j(S)$, for j>i, where i and j are numbers between 1 and n.

4. The method of claim 3, wherein the corresponding sequence of decreasingly restrictive logical tests $B_i$ include using a corresponding sequence of hash functions $h_i$ and a corresponding sequence of constants $C_i$ based on a plurality of conditions, wherein i is a number between 1 and n.

5. The method of claim 4, further including applying the corresponding sequence of hash functions $h_i$ on the sequence of characters S and comparing results of the applying to the sequence of constants $C_i$, wherein the one of the corresponding sequence of the decreasingly restrictive logical tests $B_i(S)$ is either one of $h_i(S)=C_i$, $h_i(S)<C_i$, and $h_i(S)>C_i$.

6. The method of claim 5, further including using the corresponding sequence of the hash functions for partitioning a segment into at least three regions delimited by four values corresponding to an absolute lower limit $(A_L)^{A\downarrow L}$, a preferred lower limit $(P_L)^{P\downarrow L}$, a preferred upper limit $(P_U)^{P\downarrow U}$, and an absolute upper limit $(A_U)^{A\downarrow U}$ for occurrence of the segment boundary.

7. The method of claim 6, further including setting an expected size E of the segment to be within a range between the preferred lower limit $(P_L)^{P\downarrow L}$ and the preferred upper limit $(P_U)^{P\downarrow U}$.

8. The method of claim 1, corresponding sequence of decreasingly restrictive logical tests repeatedly on each current position, wherein S of the sequence of characters S is a string of K characters extending up to the current position.

9. The method of claim 6, further including:
dividing up a range between the absolute lower limit $(A_L)^{A\downarrow L}$ and the preferred lower limit $(P_L)^{P\downarrow L}$ into sub-intervals in which the sequence of hash functions used range from $h_1$ and up to $h_{j_0-1}$,
dividing up a range between the preferred upper limit $(P_U)^{P\downarrow U}$, and the absolute upper limit $(A_U)^{A\downarrow U}$ into sub-intervals in which the sequence of hash functions used range from $h_{j_0+1}$ up to $h_n$, and
using a same hash function $(h_{j_0})$ while a size of the segment is between the preferred lower limit $(P_L)^{P\downarrow L}$ and the preferred upper limit $(P_U)^{P\downarrow U}$.

10. The method of claim 6, further including setting a highest probability $p_n$ of the sequence of probabilities to be 1 thereby limiting the segment from being extended after the absolute upper limit $(A_U)^{A\downarrow U}$.

11. The method of claim 9, further including:
choosing a large random prime number P and a large random number C, and a decreasing sequence of integers $r_1, r_2, \ldots, r_n$ subject to the constraints $r_1 > r_2 > \ldots > r_{j_0-1} > r_{j_0} = \log_2 E > r_{j_0+1} > \ldots > r_{n-1} > r_n = 0$, and
setting a value of the sequence of hash function to be a number represented by the $r_i$ rightmost bits of a binary representation of a remainder of an integer represented by a string of characters S, modulo P, and setting the $C_i$ as the integer represented by the $r_i$ rightmost bits of C.

12. A system controlling the distribution of segment sizes in a backup deduplication system in a distributed computing environment, the system comprising:
a processor device operable in the computing storage environment, wherein the processor device:
sets a subsequence of size K of a sequence of characters S, and
sets segment boundaries by using the sequence of the decreasingly restrictive logical tests if one of the sequence of the decreasingly restrictive logical tests returns a true value when applied on the sequence of characters S.

13. The system of claim 12, wherein the processor device chooses an increasing sequence of n probabilities and a corresponding sequence of n decreasingly restrictive logical tests to be applied on the sequence of characters S; and
declares segment boundaries by using the sequence of the decreasingly restrictive logical tests by deciding to declare a segment boundary at a current position if one of the sequence of the decreasingly restrictive logical tests, with a corresponding probability of the sequence of n probabilities, returns a true value when applied on the sequence of characters S.

14. The system of claim 13, wherein for every one of the sequence of characters S of the subsequence of size K, a truth of one of the corresponding sequence of the decreasingly restrictive logical tests $B_i(S)^{B\downarrow i(S)}$ implies a truth of all of a sequence of the decreasingly restrictive logical tests $B_j(S)^{Bj(S)}$, for j>i, where i and j are numbers between 1 and n.

15. The system of claim 14, wherein the corresponding sequence of decreasingly restrictive logical tests $B_i$ include using a corresponding sequence of hash functions $h_i$ and a corresponding sequence of constants $C_i$ based on a plurality of conditions, wherein i is a number between 1 and n.

16. The system of claim 15, wherein the processor device applies the corresponding sequence of hash functions $h_i$ on the sequence of characters S and comparing results of the applying to the sequence of constants $C_i$, wherein the one of the corresponding sequence of the decreasingly restrictive logical tests $B_i(S)$ is either one of $h_i(S)=C_i$, and $h_i(S)<C_i$ and $h_i(S)>C_i$.

17. The system of claim 16, wherein the processor device uses the corresponding sequence of the hash functions for partitioning a segment into at least three regions delimited by four values corresponding to an absolute lower limit $(A_L)^{A\downarrow L}$, a preferred lower limit $(P_L)^{P\downarrow L}$, a preferred upper limit $(P_U)^{P\downarrow U}$, and an absolute upper limit $(A_U)^{A\downarrow U}$ for occurrence of the segment boundary.

18. The system of claim 17, wherein the processor device sets an expected size E of the segment to be within a range between the preferred lower limit $(P_L)^{P\downarrow L}$ and the preferred upper limit $(P_U)^{P\downarrow U}$.

19. The system of claim 12, wherein the processor device performs the corresponding sequence of decreasingly restrictive logical tests repeatedly on each current position, wherein S of the sequence of characters S is a string of K characters extending up to the current position.

20. The system of claim 17, wherein the processor device:
divides up a range between the absolute lower limit $(A_L)^{A\downarrow L}$ and the preferred lower limit $(P_L)^{P\downarrow L}$ into sub-intervals in which the sequence of hash functions used range from $h_1$ and up to $h_{j_0-1}$,
divides up a range between the preferred upper limit $(P_U)^{P\downarrow U}$, and the absolute upper limit $(A_U)^{A\downarrow U}$ into sub-intervals in which the sequence of hash functions used range from $h_{j_0+1}$ up to $h_n$, and
uses a same hash function $(h_{j_0})$ while a size of a segment is between the preferred lower limit $(P_L)^{P\downarrow L}$ and the preferred upper limit $(P_U)^{P\downarrow U}$.

21. The system of claim 17, wherein the processor device sets a highest probability $p_n$ of the sequence of probabilities to be 1 thereby limiting the segment from being extended after the absolute upper limit $(A_U)^{A\downarrow U}$.

22. The system of claim 20, wherein the processor device:
chooses a large random prime number P and a large random number C, and a decreasing sequence of integers $r_1, r_2, \ldots, r_n$ subject to the constraints $r_1 > r_2 > \ldots > r_{j_0-1} > r_{j_0} = \log_2 E > r_{j_0+1} > \ldots > r_{n-1} > r_n = 0$, and
sets a value of the sequence of hash function to be a number represented by the $r_i$ rightmost bits of a binary representation of a remainder of an integer represented by a string of characters S, modulo P, and setting the $C_i$ as the integer represented by the $r_i$ rightmost bits of C.

23. A computer program product controlling the distribution of segment sizes in a backup deduplication system by a processor device in a distributed computing environment, the computer program product comprising a non-transitory computer-readable storage medium having computer-readable program code portions stored therein, the computer-readable program code portions comprising:
    a first executable portion that sets a subsequence of size K of a sequence of characters S, and
    a second executable portion that sets segment boundaries by using the sequence of the decreasingly restrictive logical tests if one of the sequence of the decreasingly restrictive logical tests returns a true value when applied on the sequence of characters S.

24. The computer program product of claim 23, further including a third executable portion that chooses an increasing sequence of n probabilities and a corresponding sequence of n decreasingly restrictive logical tests to be applied on the sequence of characters S, and
    a fourth executable portion that sets segment boundaries by using the sequence of the decreasingly restrictive logical tests by deciding to declare a segment boundary at a current position if one of the sequence of the decreasingly restrictive logical tests, with a corresponding probability of the sequence of n probabilities, returns a true value when applied on the sequence of characters S.

25. The computer program product of claim 24, wherein for every one of the sequence of characters S of the subsequence of size K, a truth of one of the corresponding sequence of the decreasingly restrictive logical tests $B_i(S)$ implies a truth of all of a sequence of the decreasingly restrictive logical tests $B_j(S)$, for $j>i$, where i and j are numbers between 1 and n.

26. The computer program product of claim 25, wherein the corresponding sequence of decreasingly restrictive logical tests $B_i$ include using a corresponding sequence of hash functions $h_i$ and a corresponding sequence of constants $C_i$ based on a plurality of conditions, wherein i is a number between 1 and n.

27. The computer program product of claim 26, further includes a fifth executable portion that applies the corresponding sequence of hash functions $h_i$ on the sequence of characters S and comparing results of the applying to the sequence of constants $C_i$, wherein the one of the corresponding sequence of the decreasingly restrictive logical tests is either one of $h_i(S)=C_i$, and $h_i(S)<C_i$ and $h_i(S)>C_i$.

28. The computer program product of claim 27, further includes a sixth executable portion that uses the corresponding sequence of the hash functions for partitioning a segment into at least three regions delimited by four values corresponding to an absolute lower limit $(A_L)^{A\downarrow L}$, a preferred lower limit $(P_L)^{P\downarrow L}$, a preferred upper limit $(P_U)$, and an absolute upper limit $(A_U)^{A\downarrow U}$ for occurrence of the segment boundary.

29. The computer program product of claim 28, further includes a seventh executable portion that sets an expected size E of the segment to be within a range between the preferred lower limit $(P_L)^{P\downarrow L}$ and the preferred upper limit $(P_U)^{P\downarrow U}$.

30. The computer program product of claim 24, further includes a fifth executable portion that performs corresponding sequence of decreasingly restrictive logical tests repeatedly on each current position, wherein S of the sequence of characters S is a string of K characters extending up to the current position.

31. The computer program product of claim 28, further includes a seventh executable portion that:
    divides up a range between the absolute lower limit $(A_L)^{A\downarrow L}$ and the preferred lower limit $(P_L)^{P\downarrow L}$ into sub-intervals in which the sequence of hash functions used range from $h_1$ and up to $h_{j_0-1}$,
    divides up a range between the preferred upper limit $(P_U)^{P\downarrow U}$, and the absolute upper limit $(A_U)^{A\downarrow U}$ into sub-intervals in which the sequence of hash functions used range from $h_{j_0+1}$ up to $h_n$, and
    uses a same hash function $(h_{j_0})$ while a size of a segment is between the preferred lower limit $(P_L)^{P\downarrow L}$ and the preferred upper limit $(P_U)^{P\downarrow U}$.

32. The computer program product of claim 28, further includes a seventh executable portion that sets a highest probability $p_n$ of the sequence of probabilities to be 1 thereby limiting the segment from being extended after the absolute upper limit $(A_U)^{A\downarrow U}$.

33. The computer program product of claim 31, further includes a eighth executable portion that:
    chooses a large random prime number P and a large random number C, and a decreasing sequence of integers $r_1, r_2, \ldots, r_n$ subject to the constraints $r_1 > r_2 > \ldots > r_{j_0-1} > r_{j_0} = \log_2 E > r_{j_0+1} > \ldots > r_{n-1} > r_n = 0$, and
    sets a value of the sequence of hash function to be a number represented by the $r_i$ rightmost bits of a binary representation of a remainder of an integer represented by a string of characters S, modulo P, and setting the $C_i$ as the integer represented by the $r_i$ rightmost bits of C.

* * * * *